(12) United States Patent
Seo et al.

(10) Patent No.: US 9,262,099 B2
(45) Date of Patent: Feb. 16, 2016

(54) NON-VOLATILE MEMORY DEVICE, ELECTRONIC CONTROL SYSTEM, AND METHOD OF OPERATING THE NON-VOLATILE MEMORY DEVICE

(75) Inventors: Myoung Kyu Seo, Gyeonggi-do (KR); Yong Soo Kim, Gyeonggi-do (KR)

(73) Assignee: INDUSTRIAL BANK OF KOREA, Seoul (KR)

( * ) Notice: Subject to any disclaimer, the term of this patent is extended or adjusted under 35 U.S.C. 154(b) by 45 days.

(21) Appl. No.: 14/009,213

(22) PCT Filed: Mar. 22, 2012

(86) PCT No.: PCT/KR2012/002047
§ 371 (c)(1),
(2), (4) Date: Oct. 1, 2013

(87) PCT Pub. No.: WO2012/134096
PCT Pub. Date: Oct. 4, 2012

(65) Prior Publication Data
US 2014/0223080 A1   Aug. 7, 2014

(30) Foreign Application Priority Data
Apr. 1, 2011  (KR) .......................... 10-2011-0030143

(51) Int. Cl.
| G06F 3/00 | (2006.01) |
| G06F 3/06 | (2006.01) |
| G11C 16/08 | (2006.01) |
| G11C 16/26 | (2006.01) |
| G11C 16/32 | (2006.01) |
| G11C 16/04 | (2006.01) |

(52) U.S. Cl.
CPC ............ *G06F 3/0688* (2013.01); *G06F 3/0619* (2013.01); *G06F 3/0629* (2013.01); *G11C 16/08* (2013.01); *G11C 16/26* (2013.01); *G11C 16/32* (2013.01); *G11C 16/0483* (2013.01)

(58) Field of Classification Search
None
See application file for complete search history.

(56) References Cited

U.S. PATENT DOCUMENTS

| 8,446,786 B2 * | 5/2013 | Pekny ........................... 365/196 |
| 2005/0160217 A1 | 7/2005 | Gonzalez et al. |

(Continued)

FOREIGN PATENT DOCUMENTS

| CN | 1741193 A | 3/2006 |
| CN | 101772810 A | 7/2010 |

(Continued)

OTHER PUBLICATIONS

International Search Report mailed Oct. 29, 2012; PCT/KR2012/002047.

(Continued)

*Primary Examiner* — Elias Mamo
(74) *Attorney, Agent, or Firm* — Ladas & Parry LLP

(57) ABSTRACT

Provided are a non-volatile memory device, an electronic control system, and a method of operating the non-volatile memory device. A non-volatile memory device according to an embodiment of the present invention includes a first NAND cell array including a first group of pages, and a second NAND cell array including a second group of pages. A plurality of X-decoders are at least one-to-one connected to the first and second NAND cell arrays. A control logic controls the plurality of X-decoders to simultaneously sense data of a first page corresponding to a start address from among the first group of pages, and data of a second page subsequent to the first page from among the second group of pages.

10 Claims, 12 Drawing Sheets

(56) References Cited

U.S. PATENT DOCUMENTS

| | | | |
|---|---|---|---|
| 2005/0162897 A1* | 7/2005 | Alva | 365/158 |
| 2006/0023554 A1 | 2/2006 | Matsushita et al. | |
| 2008/0192560 A1 | 8/2008 | Lee et al. | |
| 2009/0013148 A1* | 1/2009 | Eggleston | 711/203 |
| 2014/0379982 A1* | 12/2014 | Lim | 711/114 |

FOREIGN PATENT DOCUMENTS

| | | |
|---|---|---|
| CN | 101828172 A | 9/2010 |
| FR | 2719939 A1 | 11/1995 |
| KR | 10-0171930 B1 | 3/1999 |
| KR | 10-0172363 B1 | 3/1999 |
| KR | 20030054076 A | 7/2003 |
| KR | 100684876 B1 | 2/2007 |
| KR | 20080069480 A | 7/2008 |
| KR | 20100051804 A | 5/2010 |

OTHER PUBLICATIONS

Extended European Search Report dated Jan. 27, 2015; Appln. No. 12764518.2-1805/2696350 PCT/KR2012002047.

* cited by examiner

NON-VOLATILE MEMORY DEVICE, ELECTRONIC CONTROL SYSTEM, AND METHOD OF OPERATING THE NON-VOLATILE MEMORY DEVICE

TECHNICAL FIELD

The present invention relates to a semiconductor device and a method of controlling the same, and more particularly, to a non-volatile memory device, an electronic control system using the same, and a method of operating the non-volatile memory device and the electronic control system.

BACKGROUND ART

A non-volatile memory device such as a flash memory not only has excellent data retention characteristics, and but also has low power consumption and high impact-resistant characteristics in comparison to a hard disk. In particular, a flash memory having a NOR structure allows high-speed random access and thus is used to store codes, and a flash memory having a NAND structure has a high level of integration and allows a page operation, and thus is generally used to store data. The above-described flash memory is required to sequentially exchange data with a host according to a product or an interface.

DETAILED DESCRIPTION OF THE INVENTION

Technical Problem

Due to a sufficiently high speed of reading data, a NOR flash memory may read and prepare to output data of a page during data of another page is output. However, a NAND flash memory having a low capacity may not completely read and prepare to output data of a page during data of another page is output. Also, if a start address for starting to read data is located near a last part of a page, continuous reading of pages may not be easily acheived.

The present invention is aimed to solve various problems including the above-described problem, and provides a non-volatile memory device capable of continuously reading data, an electronic control system using the non-volatile memory device, and a method of operating the non-volatile memory device. However, the scope of the present invention is not limited thereto.

Technical Solution

According to an aspect of the present invention, there is provided a non-volatile memory device including a first NAND cell array including a first group of pages, and a second NAND cell array including a second group of pages. A plurality of X-decoders are at least one-to-one connected to the first and second NAND cell arrays. A control logic controls the plurality of X-decoders to simultaneously sense data of a first page corresponding to a start address from among the first group of pages, and data of a second page subsequent to the first page from among the second group of pages.

In the non-volatile memory device, the control logic controls the plurality of X-decoders to sense data of a third page subsequent to the second page during the data of the second page is output to an external apparatus.

In the non-volatile memory device, the first group of pages may include the third page, and the third page may be disposed in a row next to the first page.

The non-volatile memory device may further include a third NAND cell array including a third group of pages, and the third group of pages may include the third page.

The non-volatile memory device may further include a plurality of page buffers at least one-to-one connected to the first and second NAND cell arrays so as to sense and latch data of the first and second NAND cell arrays.

The non-volatile memory device may further include an input address detection unit for detecting the start address.

In the non-volatile memory device, wherein the control logic may continuously output data of the first and second NAND cell arrays from the start address via a serial peripheral interface (SPI) to an external apparatus with no latency between pages.

According to another aspect of the present invention, there is provided a non-volatile memory device including a plurality of NAND cell arrays each including a plurality of pages. A plurality of X-decoders are at least one-to-one connected to the plurality of NAND cell arrays. A plurality of page buffers are at least one-to-one connected to the plurality of NAND cell arrays so as to sense and latch data of the plurality of NAND cell arrays. A control logic controls the plurality of X-decoders to simultaneously sense data of a first page of a first NAND cell array corresponding to a start address from among the plurality of NAND cell arrays, and data of a second page of a second NAND cell array subsequent to the first page, in order to sequentially output the data of the plurality of NAND cell arrays from the start address.

According to another aspect of the present invention, there is provided a non-volatile memory device including a plurality of NAND cell arrays each including a plurality of pages. A plurality of X-decoders are at least one-to-one connected to the plurality of NAND cell arrays. A plurality of page buffers are at least one-to-one connected to the plurality of NAND cell arrays so as to sense and latch data of the plurality of NAND cell arrays. A control logic controls a data read operation so as to sequentially output data of the plurality of NAND cell arrays from a start address via a serial peripheral interface (SPI) to an external apparatus with no latency between pages.

According to another aspect of the present invention, there is provided an electronic control system including a host; and a memory chip for exchanging data with the host via a serial peripheral interface (SPI). The memory chip includes at least one of the above-described non-volatile memory devices.

According to another aspect of the present invention, there is provided a method of operating a non-volatile memory device. The method includes detecting a start address of a first NAND cell array including a first group of pages, and a second NAND cell array including a second group of pages; and simultaneously sensing data of a first page corresponding to the start address from among the first group of pages, and data of a second page subsequent to the first page from among the second group of pages.

The method may further include sensing data of a third page subsequent to the second page during the data of the second page is output to an external apparatus.

In the method, the simultaneous sensing may include sensing and latching the data of the first and second pages respectively on first and second page buffers corresponding to the first and second pages.

Advantageous Effects

Based on a non-volatile memory device according to an embodiment of the present invention, a chip structure and an operating method capable of increasing data capacity by using NAND cell arrays and of allowing high-speed data output may be provided. For example, when data is output from NAND cell arrays, all data from a start address may be sequentially and continuously output with no latency between pages.

BEST MODE

Figure 1:
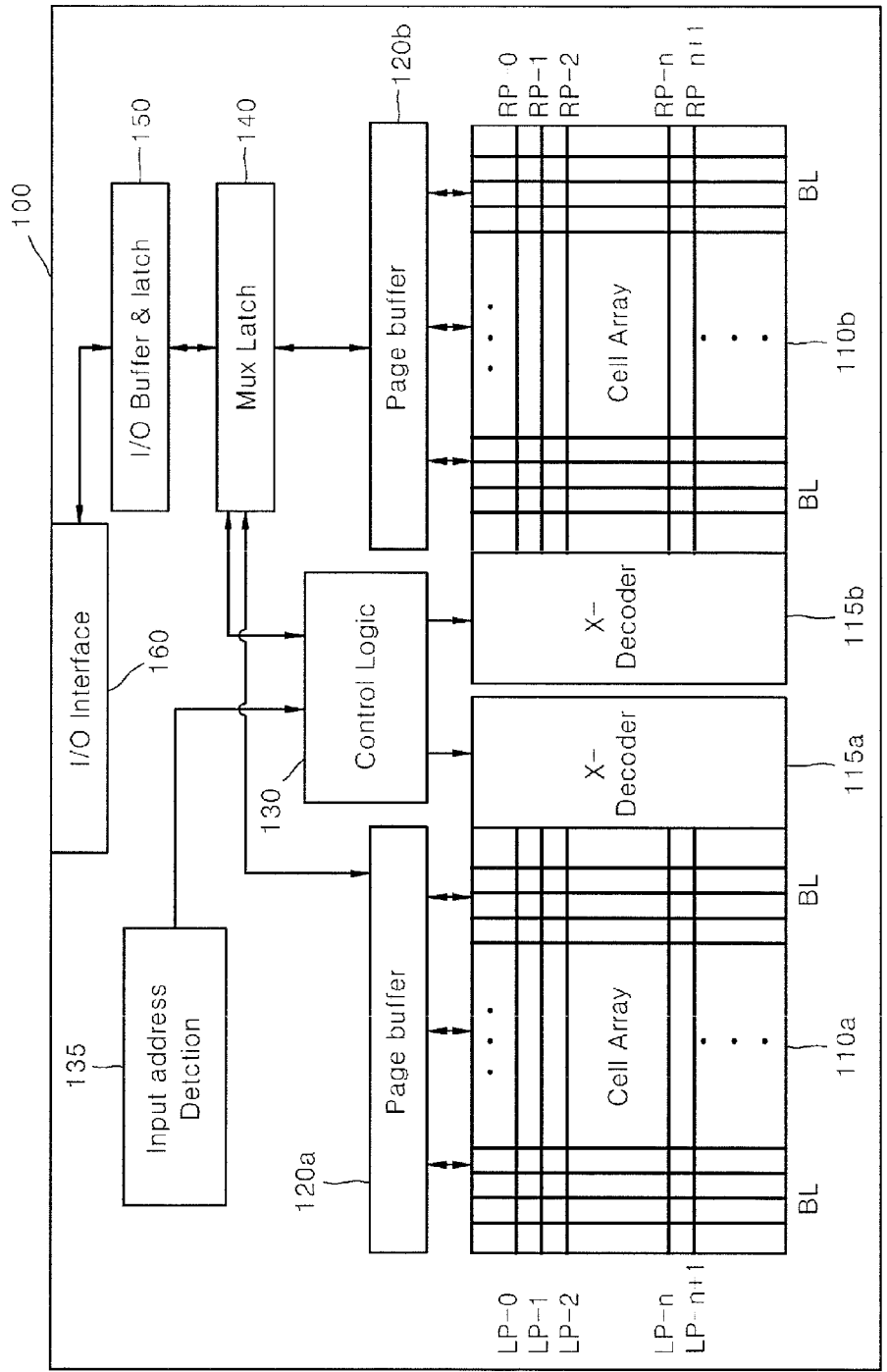
FIG. 1 is a block diagram of a non-volatile memory device according to an embodiment of the present invention.

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements may be exaggerated for convenience of explanation.

A non-volatile memory device according to embodiments of the present invention may refer to a memory device capable of retaining data even when power is cut off. For example, the non-volatile memory device may include a flash memory, an electrically erasable programmable read-only memory (EEPROM), a phase-change random access memory (PRAM), a magnetic random access memory (MRAM), or a resistive random access memory (RRAM). The flash memory may also be referred to as a floating gate memory, a charge trapping memory, or a silicon-oxide-nitride-oxide-silicon (SONOS) memory, and the above names do not limit the scope of the embodiments.

In embodiments of the present invention, a NAND cell array may refer to an array of memory cells having a NAND structure.

Figure 2:
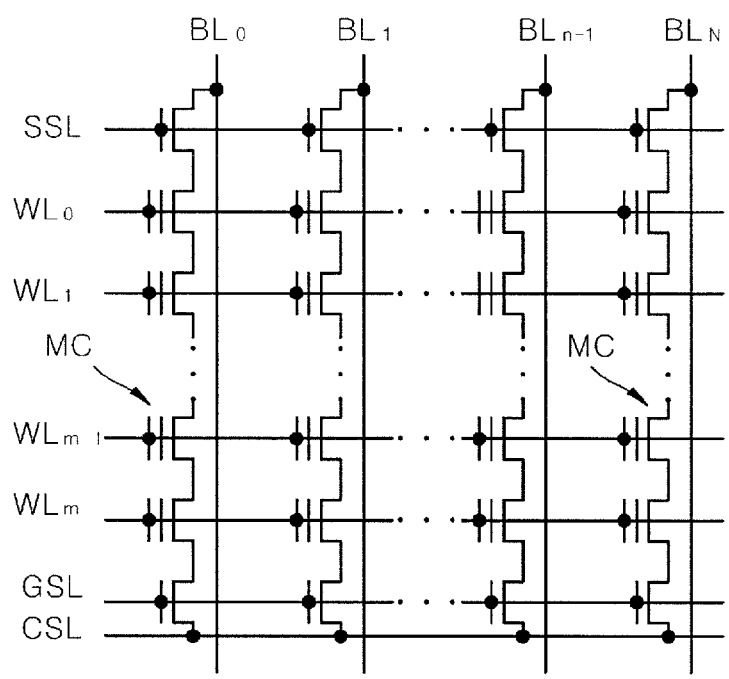
FIG. 2 is a circuit diagram of an example of a portion of a NAND cell array in the non-volatile memory device of FIG. 1.

FIG. 1 is a block diagram of a non-volatile memory device 100 according to an embodiment of the present invention. FIG. 2 is a circuit diagram of an example of a portion of a NAND cell array in the non-volatile memory device 100 of FIG. 1.

Referring to FIG. 1, NAND cell arrays 110a and 110b may be separate from each other and may be aligned in parallel. The NAND cell array 110a may include a group of pages LP, and the NAND cell array 110b may include another group of pages RP. The group of the pages LP and the other group of the pages RP may be separate from each other and may be aligned in parallel. For example, the NAND cell arrays 110a and 110b may have the same structure and may be aligned in a line in a row direction. In this case, the group of the pages LP may form left half pages, and the other group of the pages RP may form right half pages.

For example, as illustrated in FIG. 2, each of the NAND cell arrays 110a and 110b may include a plurality of memory cells MC aligned in a matrix. For example, the memory cells MC aligned in the same column may be connected to each other in series, and the memory cell MC disposed at one end of each column may be connected to a bit line and the other end of each column may be connected to a common source line CSL. The bit-lines BL may extend in a column direction and may be connected to sources and drains of the memory cells MC, and word-lines WL may extend in a row direction and may be coupled to control gates of the memory cells MC.

A connection between a first word-line WL0 and the bit-lines BL may be controlled by a string selection line SSL. The string selection line SSL may be connected to gates of string selection transistors. Also, a connection between the memory cells MC and the common source line CSL may be controlled by a ground selection line GSL. The ground selection line GSL may be connected to gates of ground selection transistors.

The memory cells MC aligned in each row may form a page (see LP and RP of FIG. 1). For example, a first page LP-0 of the NAND cell array 110a and a first page RP-0 of the NAND cell array 110b may include the memory cells MC connected to the first word-line WL0. Also, an nth page LP-n of the NAND cell array 110a and an nth page RP-n of the NAND cell array 110b may include the memory cells MC connected to an nth word-line WLn.

Since the above-described NAND cell arrays 110a and 110b have a serial connection structure and thus a contact structure for connecting the memory cells MC in each string may be omitted, in comparison to cell arrays having a NOR structure, a high level of integration may be achieved. However, since the NAND cell arrays 110a and 110b may not easily provide high-speed random access in comparison to cell arrays having a NOR structure, a serial peripheral interface (SPI) structure using one serial output terminal may not be easily achieved. In this regard, the non-volatile memory device 100 according to the current embodiment may provide a cell structure capable of increasing data capacity by using the NAND cell arrays 110a and 110b and of achieving high-speed output as described below even when one serial output terminal is used.

Referring to FIGS. 1 and 2 together, each of the NAND cell arrays 110a and 110b may include a structure in which a plurality of blocks each having the circuit structure of FIG. 2 are connected. The number of bit-lines BL and the number of word-lines WL in one block may be appropriately selected according to a block size, and do not limit the scope of the current embodiment. Also, each of the NAND cell arrays 110a and 110b may operate by separating the bit-lines BL into even bit-lines and odd bit-lines.

The NAND cell array 110a may be connected to an X-decoder 115a, and the NAND cell array 110b may be connected to an X-decoder 115b. The X-decoders 115a and 115b may be separate from each other and may be aligned in parallel. In more detail, the X-decoder 115a may be connected to the pages LP and may control the word-lines WL in the NAND cell array 110a, and the X-decoder 115b may be connected to the pages RP and may control the word-lines WL in the NAND cell array 110b. If the NAND cell arrays 110a and 110*b* have the same memory capacity, the X-decoders 115*a* and 115*b* may have the same structure.

For example, the X-decoder 115*a* may include a decoding unit for decoding address information of the memory cells MC in the NAND cell array 110*a*, and an X-multiplexer/driver for driving the pages LP according to the address information. The X-decoder 115*b* may include a decoding unit for decoding address information of the memory cells MC in the NAND cell array 110*b*, and an X-multiplexer/driver for driving the pages RP according to the address information. As such, the two groups of the pages LP and RP may be sequentially or simultaneously driven by individually using the two X-decoders 115*a* and 115*b*.

In order to sense and latch data, the NAND cell arrays 110*a* and 110*b* may be one-to-one connected to page buffers 120*a* and 120*b*. For example, the bit-lines BL of the NAND cell array 110*a* may be connected to the page buffer 120*a*, and the bit-lines BL of the NAND cell array 110*b* may be connected to the page buffer 120*b*. Since the page buffers 120*a* and 120*b* are separate from each other as described above, operations of the NAND cell arrays 110*a* and 110*b* may be independently performed.

Each of the page buffers 120*a* and 120*b* may include a sense amplifier for sensing and latching data. For example, the sense amplifier may include a sense unit and a latch unit. If the NAND cell arrays 110*a* and 110*b* have the same memory capacity, the page buffers 120*a* and 120*b* may have the same structure. If the NAND cell arrays 110*a* and 110*b* operate by separating even columns from odd columns, the capacity of each of the page buffers 120*a* and 120*b* may correspond to ½ of the capacity of each of the NAND cell arrays 110*a* and 110*b*.

The page buffers 120*a* and 120*b* may be connected to an input/output (I/O) buffer & latch unit 150 via a multiplexer latch unit 140. The I/O buffer & latch unit 150 may be connected to an I/O interface 160. The I/O buffer & latch unit 150 may be used as a data buffer during data input and output between the I/O interface 160 and an external apparatus. For example, the I/O interface 160 may include a serial peripheral interface (SPI) or a parallel interface. The multiplexer latch unit 140 may adjust data output from the page buffers 120*a* and 120*b* to the I/O buffer & latch unit 150, or data input from the I/O buffer & latch unit 150 to the page buffers 120*a* and 120*b*.

A control logic 130 may control the X-decoders 115*a* and 115*b* in order to control read and write operations of the NAND cell arrays 110*a* and 110*b*, and may control the multiplexer latch unit 140 in order to control data input and output of the page buffers 120*a* and 120*b*. For example, the control logic 130 may form a read control circuit when data of the NAND cell arrays 110*a* and 110*b* are sequentially and continuously output as described below. In the current embodiment, the control logic 130 is illustrated to mainly control a multiplexer. However, the control logic 130 is not limited thereto and may control all core and peripheral circuits of the non-volatile memory device 100.

An input address detection unit 135 may be connected to the control logic 130 so as to provide start address information in a read operation. For example, the input address detection unit 135 may perform an operation of detecting and latching input address information. For example, the input address detection unit 135 may detect and latch the start address information.

In the non-volatile memory device 100 according to the current embodiment, for convenience of explanation, the NAND cell arrays 110*a* and 110*b*, the pages LP, the X-decoders 115*a* and 115*b*, and the page buffers 120*a* and 120*b* may be separately referred by using ordinal numbers (e.g., first and second). For example, a NAND cell array corresponding to a start address in a read operation may be referred to as a first NAND cell array, and another NAND cell array may be referred to as a second NAND cell array. In this case, the first NAND cell array may include a first group of pages, and the second NAND cell array may include a second group of pages. Also, the first NAND cell array may be connected to a first X-decoder and a first page buffer, and the second NAND cell array may be connected to a second X-decoder and a second page buffer.

Figure 3:
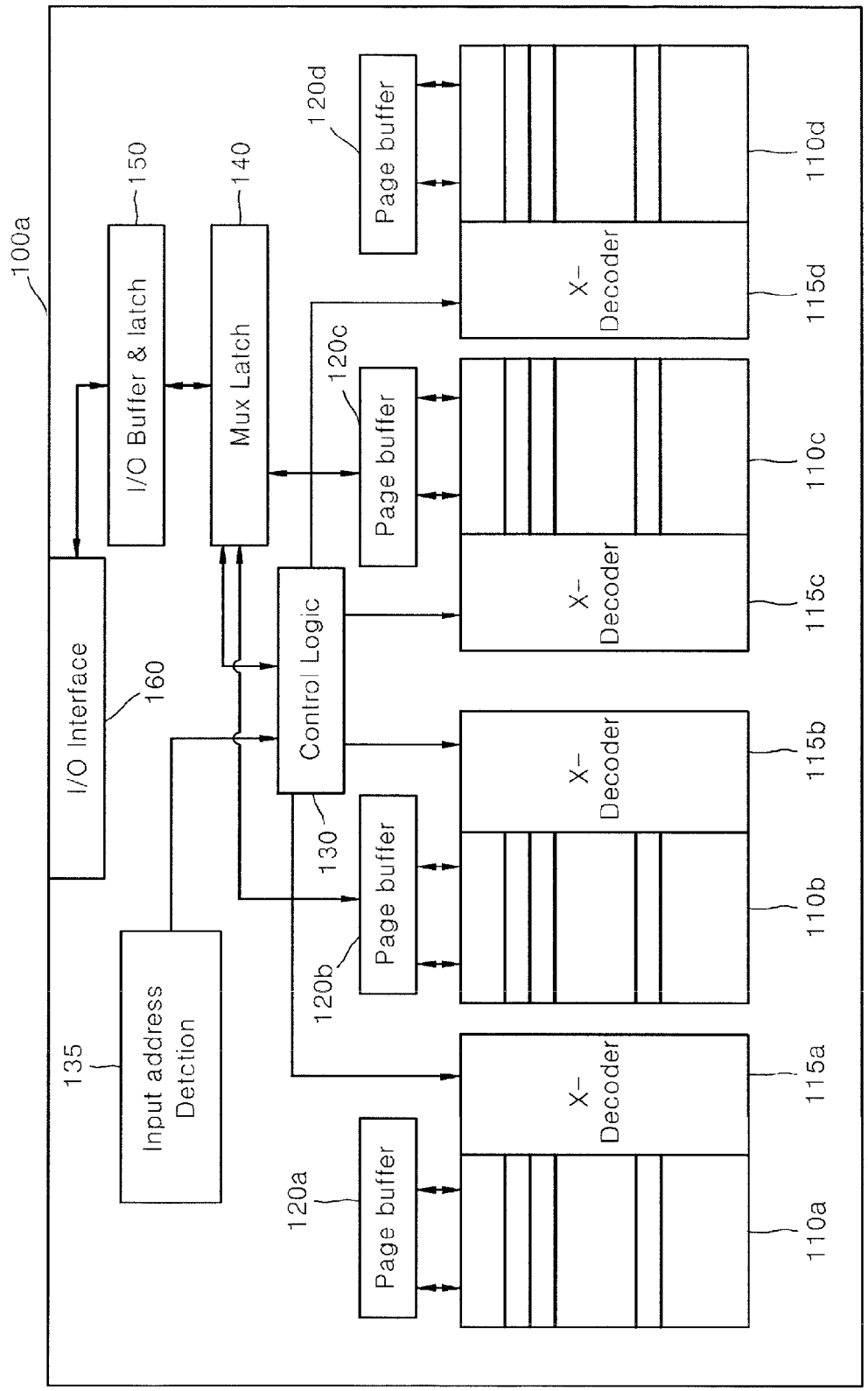
FIG. 3 is a block diagram of a non-volatile memory device according to another embodiment of the present invention.

FIG. 3 is a block diagram of a non-volatile memory device 100*a* according to another embodiment of the present invention. The non-volatile memory device 100*a* according to the current embodiment is partially modified from the non-volatile memory device 100 of FIG. 1, and thus repeated descriptions in the two embodiments are not provided here.

Referring to FIG. 3, the non-volatile memory device 100*a* may include NAND cell arrays 110*a*, 110*b*, 110*c*, and 110*d*. For example, the NAND cell arrays 110*a*, 110*b*, 110*c*, and 110*d* may be formed in the same structure and may have the same capacity. The illustrated number and alignment of the NAND cell arrays 110*a*, 110*b*, 110*c*, and 110*d* are exemplarily provided. For example, one of the NAND cell arrays 110*a*, 110*b*, 110*c*, and 110*d* may be omitted, or a plurality of NAND cell arrays (not shown) may be added. Besides, although the NAND cell arrays 110*a*, 110*b*, 110*c*, and 110*d* are aligned in a line, they may be aligned in two or more lines.

X-decoders 115*a*, 115*b*, 115*c*, and 115*d* may be one-to-one connected to the NAND cell arrays 110*a*, 110*b*, 110*c*, and 110*d* in a row direction, and page buffers 120*a*, 120*b*, 120*c*, and 120*d* may be one-to-one connected to the NAND cell arrays 110*a*, 110*b*, 110*c*, and 110*d* in a column direction. For example, the X-decoder 115*a* and the page buffer 120*a* may be connected to the NAND cell array 110*a*, the X-decoder 115*b* and the page buffer 120*b* may be connected to the NAND cell array 110*b*, the X-decoder 115*c* and the page buffer 120*c* may be connected to the NAND cell array 110*c*, and the X-decoder 115*d* and the page buffer 120*d* may be connected to the NAND cell array 110*d*.

The page buffers 120*a*, 120*b*, 120*c*, and 120*d* may be connected to so as to exchange data with the multiplexer latch unit 140. The control logic 130 may be connected to the X-decoders 115*a*, 115*b*, 115*c*, and 115*d*, and the multiplexer latch unit 140 so as to control operation of the non-volatile memory device 100*a*.

In the non-volatile memory device 100*a* according to the current embodiment, for convenience of explanation, the NAND cell arrays 110*a*, 110*b*, 110*c*, and 110*d*, the X-decoders 115*a*, 115*b*, 115*c*, and 115*d*, and the page buffers 120*a*, 120*b*, 120*c*, and 120*d* may be separately referred by using ordinal numbers (e.g., first through fourth). For example, a NAND cell array corresponding to a start address in a read operation may be referred to as a first NAND cell array, and subsequent NAND cell arrays may be referred to as a second NAND cell array, a third NAND cell array, and a fourth NAND cell array. In this case, the first NAND cell array may be connected to a first X-decoder and a first page buffer, the second NAND cell array may be connected to a second X-decoder and a second page buffer, the third NAND cell array may be connected to a third X-decoder and a third page buffer, and the fourth NAND cell array may be connected to a fourth X-decoder and a fourth page buffer.

Figure 4:
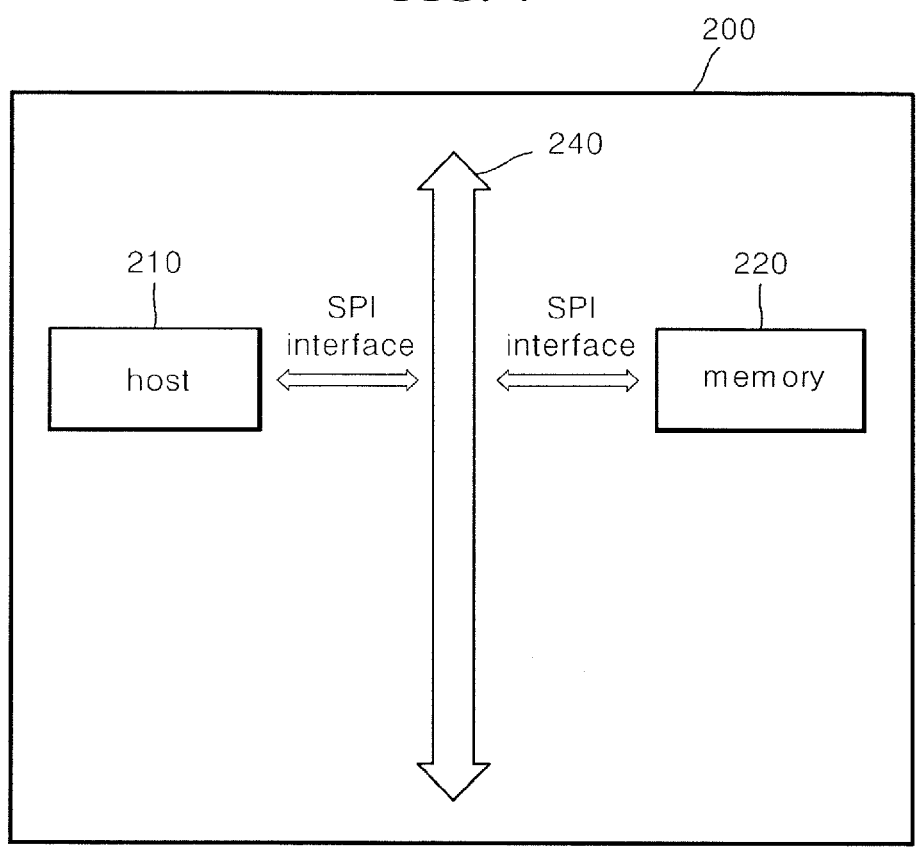
FIG. 4 is a block diagram of an electronic control system according to an embodiment of the present invention.

FIG. 4 is a block diagram of an electronic control system 200 according to an embodiment of the present invention.

Referring to FIG. 4, a host 210 and a memory chip 220 may be connected to each other so as to exchange data via an interface 240. For example, the interface 240 may include an SPI. In this case, the host 210 may operate as a master device, and the memory chip 220 may operate as a slave device. Besides, data may be transmitted between the memory chip 220 and the host 210 via one pin.

The memory chip 220 may include at least one of the above-described non-volatile memory devices 100 and 100*a*. The host 210 may include a controller for controlling the memory chip 220, for example, a central processing unit (CPU). Optionally, the electronic control system 200 may further include an I/O apparatus (not shown) for transmitting and receiving data to and from an external apparatus. The host 210 may receive an input of data via the I/O apparatus so as to store the data in the memory chip 220, or may output the data stored in the memory chip 220 via the I/O apparatus. For example, the above-described electronic control system 200 may include a computer, a cellular phone, a mobile device, a personal digital assistant (PDA), a navigation device, or a home appliance.

A continuous read operation of a non-volatile memory device according to an embodiment of the present invention will now be described with reference to FIGS. 5 through 8.

Figure 5:
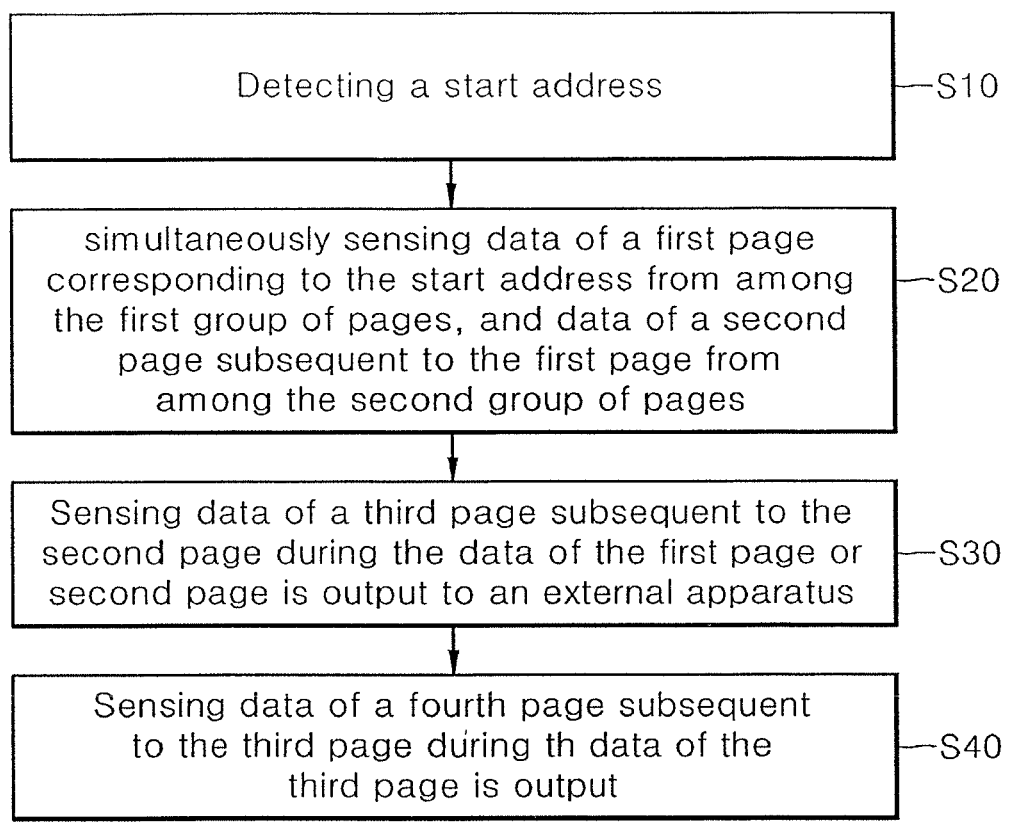
FIG. 5 is a flowchart of a method of operating a non-volatile memory device, according to an embodiment of the present invention.

Referring to FIG. 5, a start address in NAND cell arrays is detected (S10). Then, data of a first page corresponding to the start address in a first NAND cell array and data of a second page subsequent to the first page in a second NAND cell array are simultaneously sensed (S20). For example, data may be sensed and latched on a first page buffer by driving a first X-decoder connected to the first NAND cell array and, at the same time, data may be sensed and latched on a second page buffer by driving a second X-decoder connected to the second NAND cell array.

Then, the data of the first page and/or the data of the second page may be output to an external apparatus and, during the data is output, data of a third page subsequent to the second page may be sensed (S30). For example, data may be sensed and latched on a third page buffer by driving a third X-decoder connected to the third page. The third page may be included in the first NAND cell array or a third NAND cell array. If the third page is included in the first NAND cell array, the third X-decoder may be the same as the first X-decoder.

Then, during the data of the third page is output, data of a fourth page subsequent to the third page may be output to the external apparatus (S40). For example, data may be sensed and latched on a fourth page buffer by driving a fourth X-decoder connected to the fourth page. The fourth page may be included in the first or second NAND cell array. Operation S40 may be repeated to sequentially and continuously output all data to the external apparatus.

Figure 6:
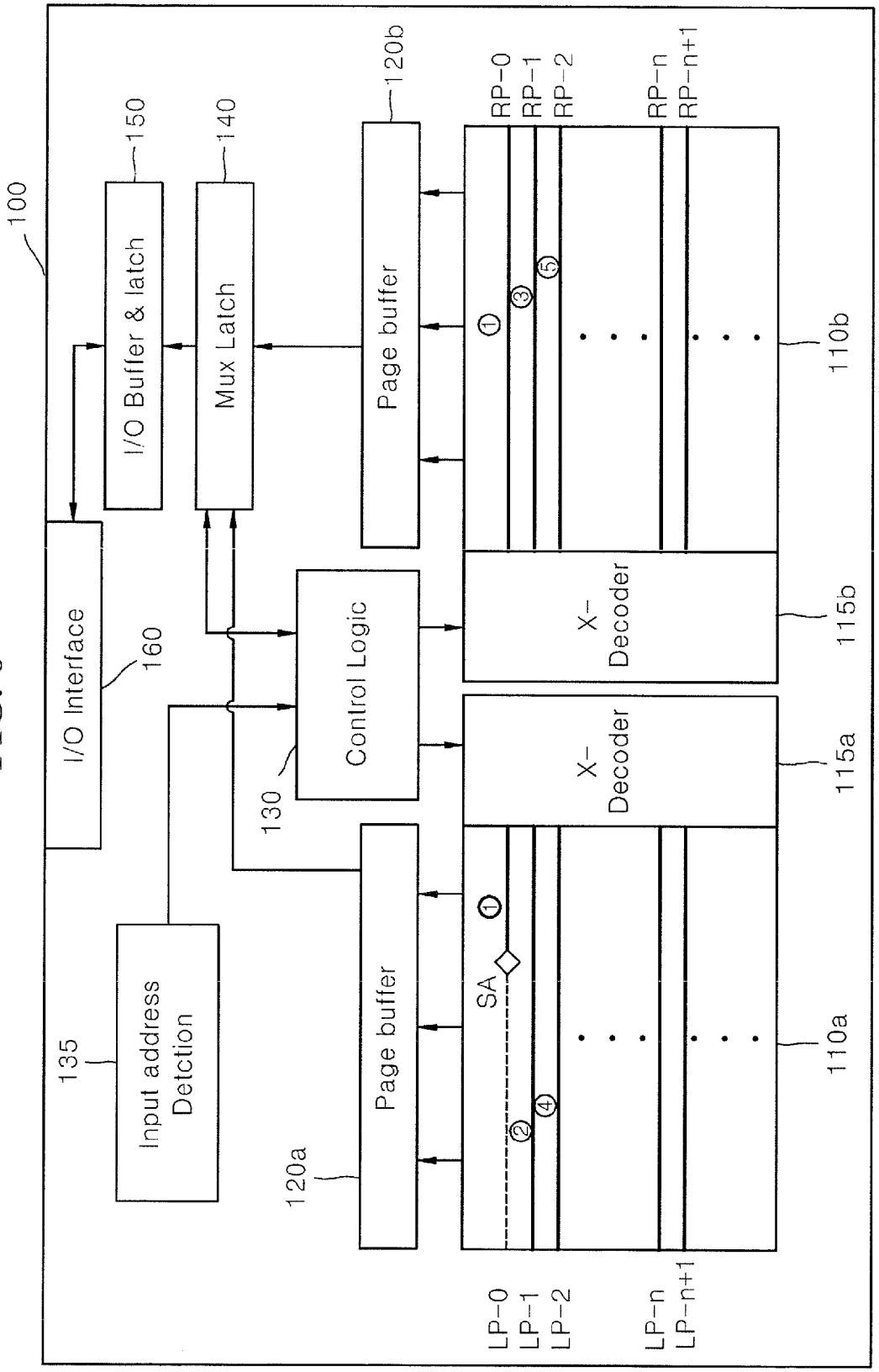
FIGS. 6 and 7 are block diagrams for describing a method of operating a non-volatile memory device based on the location of a start address, according to an embodiment of the present invention.
Figure 7:
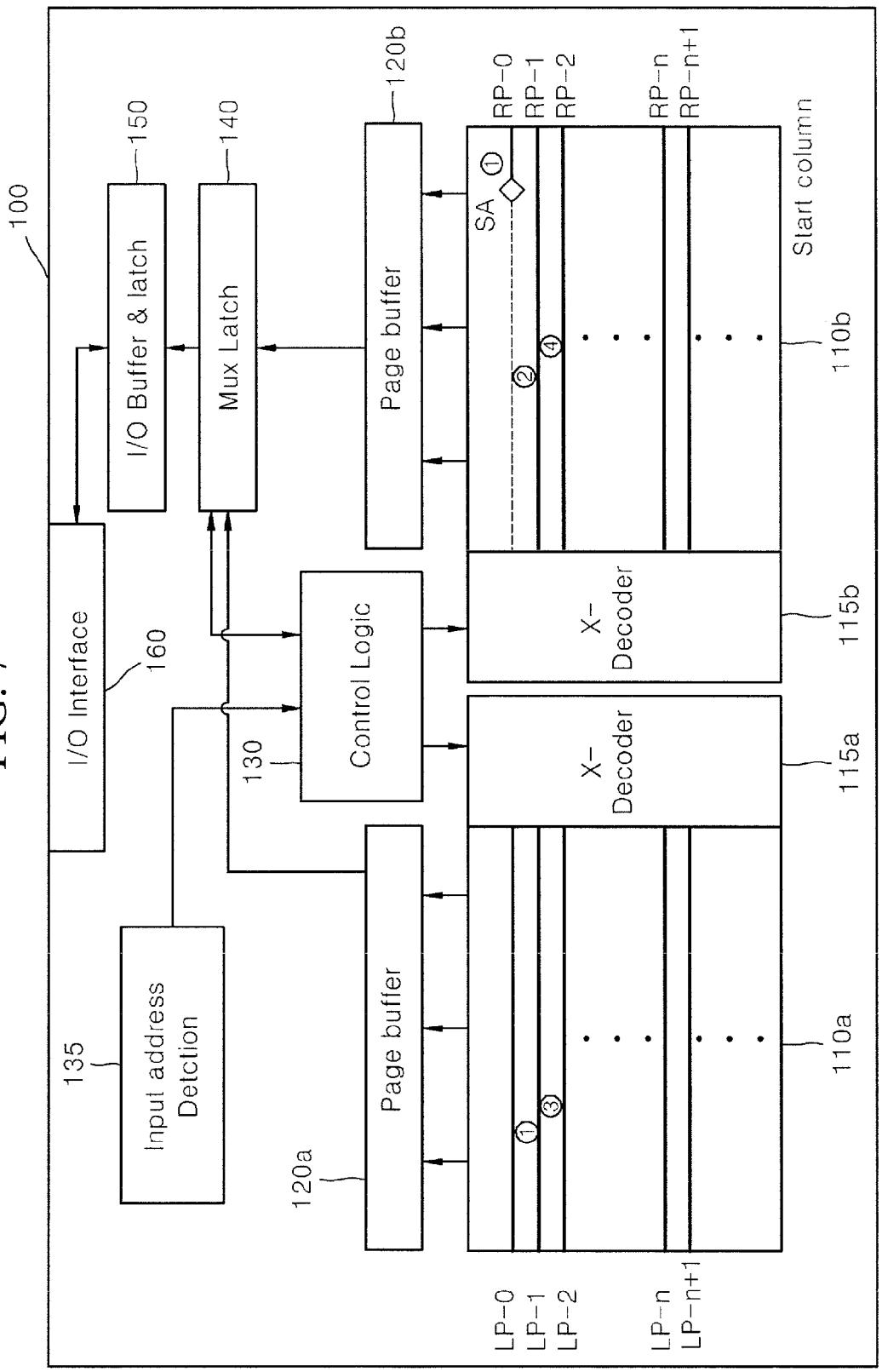
Figure 8:
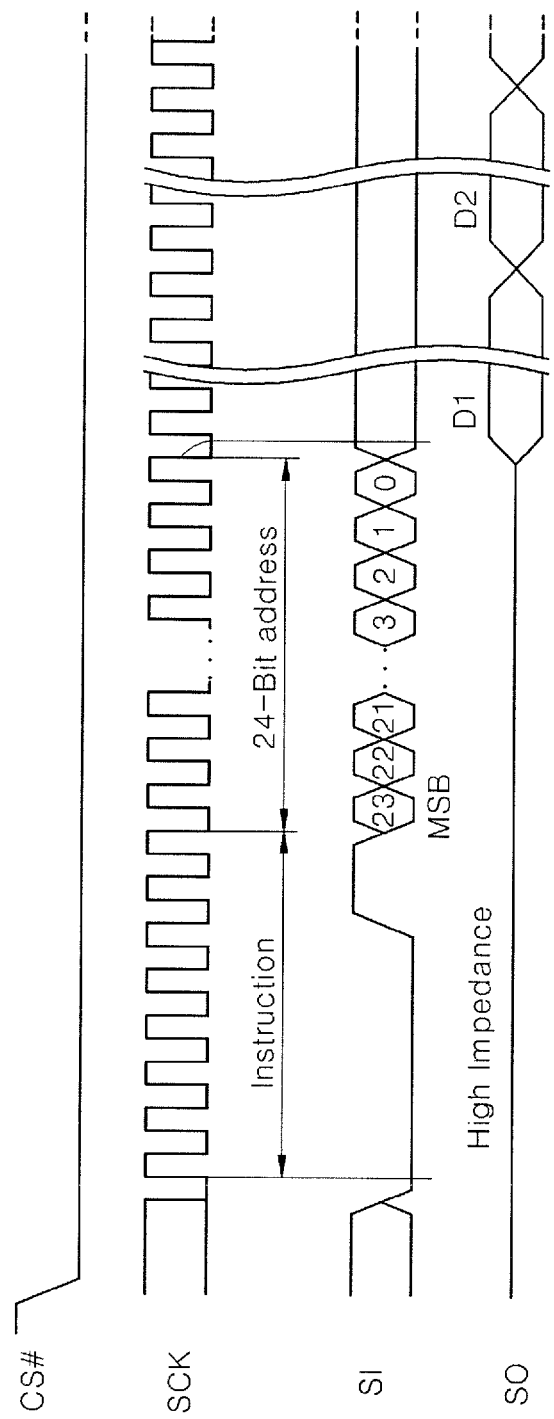
FIG. 8 is a timing diagram of a method of operating a non-volatile memory device according to embodiments of the present invention.

FIGS. 6 and 7 are block diagrams for describing a method of operating a non-volatile memory device based on the location of a start address SA, according to an embodiment of the present invention. FIG. 8 is a timing diagram of a method of operating a non-volatile memory device according to embodiments of the present invention.

Referring to FIG. 6, data of a first page LP-0 corresponding to the start address SA and data of a second page RP-0 subsequent to the first page LP-0 may be simultaneously sensed (①). For example, the first page LP-0 may be included in the NAND cell array 110*a*, and the second page RP-0 may be included in the NAND cell array 110*b*. The data of the first and second pages LP-0 and RP-0 may be respectively sensed and latched on the page buffers 120*a* and 120*b*.

Then, during the data of the first page LP-0 after the start address SA and the data of the second page RP-0 are sequentially output via the multiplexer latch unit 140, data of a third page LP-1 may be sensed and latched on the page buffer 120*a* (②). In this case, the third page LP-1 may be included in the NAND cell array 110*a*, and may be disposed in a row directly under the first page LP-0.

Then, during the data of the third page LP-1 is output, data of a subsequent fourth page RP-1 may be sensed (③). The fourth page RP-1 may be included in the NAND cell array 110*b*, and the data of the fourth page RP-1 may be latched on the page buffer 120*b*. Then, during the data of the fourth page RP-1 is output, data of a subsequent fifth page LP-2 may be sensed (④). The fifth page LP-2 may be included in the NAND cell array 110*a*, and the data of the fifth page LP-2 may be latched on the page buffer 120*a*.

As such, the data of the first through fourth pages LP-0, RP-0, LP-1, and RP-1 from the start address SA may be sequentially and continuously output. In particular, except for initial data sensing, since data of a page is sensed within a time for outputting data of a previous page, data from the start address SA may be continuously output with no latency between pages. Besides, if the above-described read operation is repeated, all data from the start address SA may be continuously output with no latency.

Referring to FIG. 7, data of a first page RP-0 corresponding to the start address SA and data of a second page LP-1 subsequent to the first page RP-0 may be simultaneously sensed (①). For example, the first page RP-0 may be included in the NAND cell array 110*b*, and the second page LP-1 may be included in the NAND cell array 110*a*. The data of the first and second pages RP-0 and LP-1 may be respectively sensed and latched on the page buffers 120*b* and 120*a*.

In the current embodiment, although the first and second pages RP-0 and LP-1 are disposed in different adjacent rows, since the X-decoders 115*b* and 115*a* and the page buffers 120*b* and 120*a* are separately used, the data of the first and second pages RP-0 and LP-1 may be simultaneously sensed. The reason why the data of the first and second pages RP-0 and LP-1 are simultaneously sensed is because the start address SA of the first page RP-0 is located near the last column in a first row. As such, the data of the subsequent second page LP-1 may not be easily sensed within a short time for outputting the data of the first page RP-0 from the start address SA. In general, a predetermined latency is provided after the data of the first page RP-0 is output, and thus a time for reading the data of the second page LP-1 is ensured.

However, in the current embodiment, during the data of the first page RP-0 after the start address SA, which is latched on the page buffer 120*b*, and the data of the second page LP-1, which is latched on the page buffer 120*a*, are sequentially output via the multiplexer latch unit 140, data of a third page RP-1 of the NAND cell array 110*b* may be sensed (②). Accordingly, there is no need to provide a latency for sensing the data of the third page RP-1.

Then, during the data of the third page RP-1 is output, data of a subsequent fourth page LP-2 of the NAND cell array 110*a* may be sensed and latched on the page buffer 120*a* (③). Then, during the data of the fourth page LP-2 is output, data of a subsequent fifth page RP-2 of the NAND cell array 110*b* may be sensed and latched on the page buffer 120*b* (④).

Accordingly, the data of the first through fourth pages RP-0, LP-1, RP-1, and LP-2 from the start address SA may be sequentially and continuously output. In particular, except for initial data sensing, since data of a page is sensed within a time for outputting data of a previous page, data from the start address SA may be continuously output with no latency between pages. Besides, if the above-described read operation is repeated, all data from the start address SA may be continuously output with no latency.

As such, data may be read at a high speed and thus a read performance of a non-volatile memory device may be improved. The above high-speed continuous read performance may satisfy the standard of a product using an SPI, as illustrated in FIG. 8. In more detail, if a chip selection signal is input to a chip selection terminal CS#, an instruction and an address may be sequentially input to a serial input terminal SI according to a clock signal of a serial clock terminal SCK. After the address is input, data D1, D2, etc. may be sequentially output to a serial output terminal SO with no latency.

FIGS. 9 through 12 are block diagrams for describing a method of operating a non-volatile memory device based on the location of a start address, according to another embodiment of the present invention. The method according to the current embodiment is partially modified from the method of FIGS. 6 and 7, and thus repeated descriptions in the two embodiments are not provided here.

Figure 9:
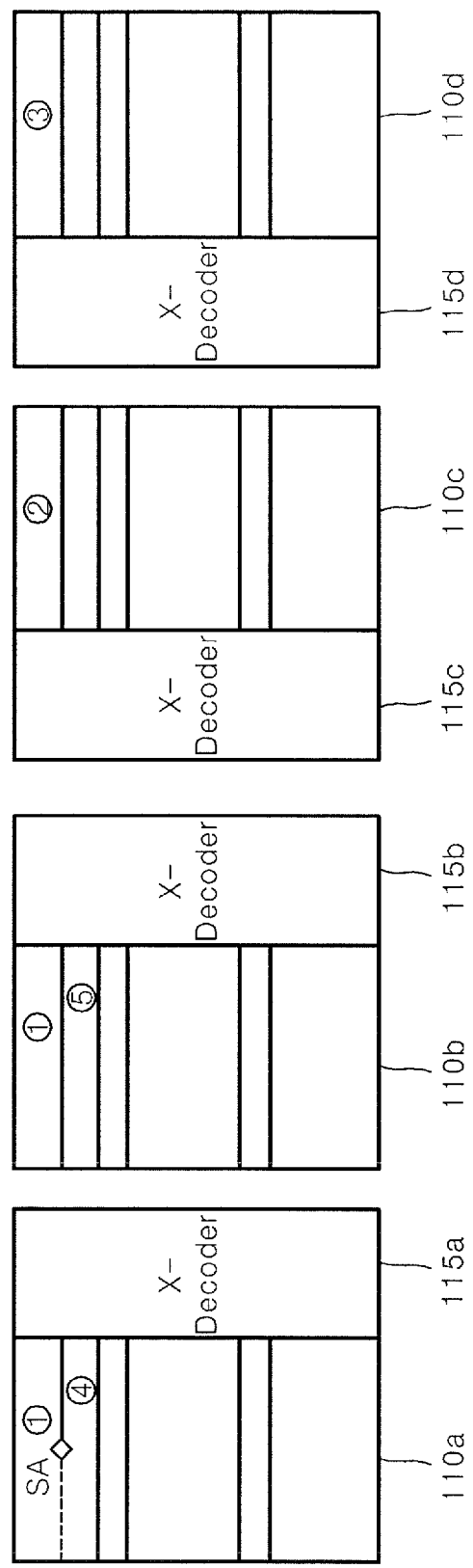
FIGS. 9 through 12 are block diagrams for describing a method of operating a non-volatile memory device based on the location of a start address, according to another embodiment of the present invention.

Referring to FIG. 9, if the start address SA corresponds to the NAND cell array 110a, initially, data of first and second pages of the NAND cell arrays 110a and 110b may be simultaneously sensed and latched (①). Then, during the data of the second page is output, data of a subsequent third page of the NAND cell array 110c may be sensed and latched (②). Then, during the data of the third page is output, data of a subsequent fourth page of the NAND cell array 110d may be sensed and latched (③). Then, during the data of the fourth page is output, data of a subsequent fifth page of the NAND cell array 110a may be sensed and latched (④).

Figure 10:
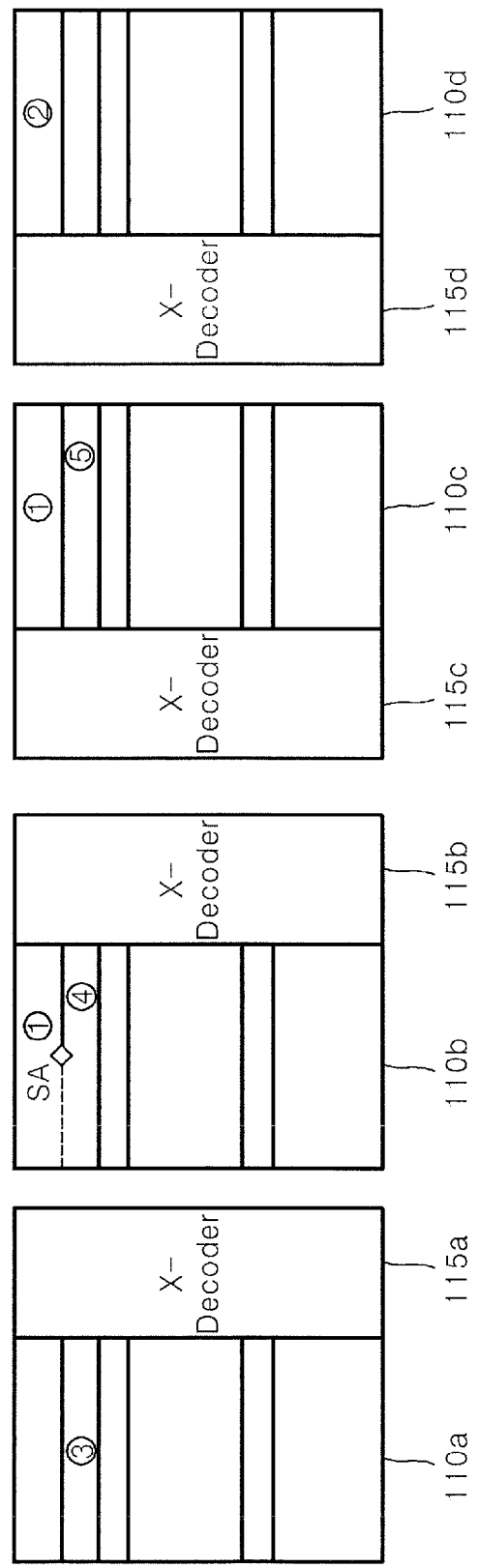

Referring to FIG. 10, if the start address SA corresponds to the NAND cell array 110b, initially, data of first and second pages of the NAND cell arrays 110b and 110c may be simultaneously sensed and latched (①). Then, during the data of the second page is output, data of a subsequent third page of the NAND cell array 110d may be sensed and latched (②). Then, during the data of the third page is output, data of a subsequent fourth page of the NAND cell array 110a may be sensed and latched (③). Then, during the data of the fourth page is output, data of a subsequent fifth page of the NAND cell array 110b may be sensed and latched (④).

Figure 11:
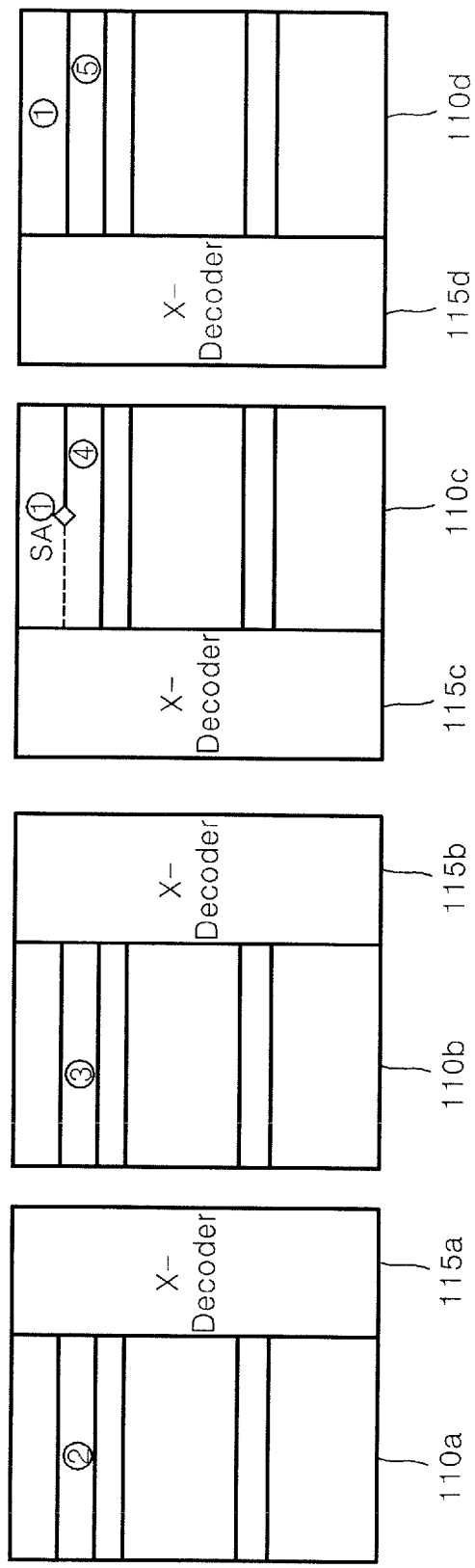

Referring to FIG. 11, if the start address SA corresponds to the NAND cell array 110c, initially, data of first and second pages of the NAND cell arrays 110c and 110d may be simultaneously sensed and latched (①). Then, during the data of the second page is output, data of a subsequent third page of the NAND cell array 110a may be sensed and latched (②). Then, during the data of the third page is output, data of a subsequent fourth page of the NAND cell array 110b may be sensed and latched (③). Then, during the data of the fourth page is output, data of a subsequent fifth page of the NAND cell array 110c may be sensed and latched (④).

Figure 12:
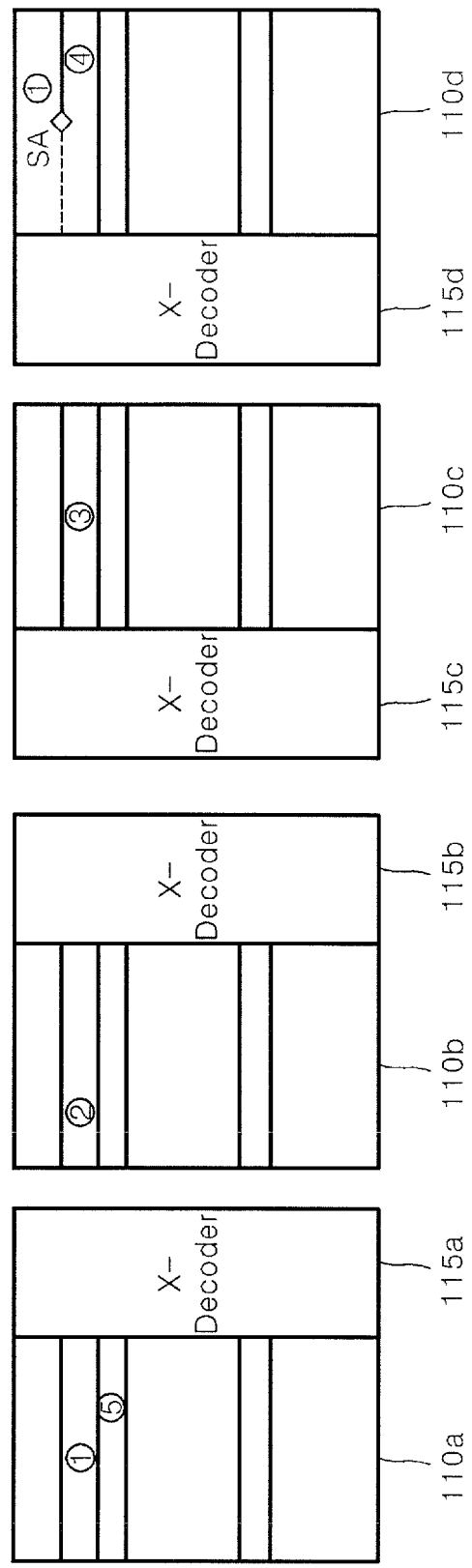

Referring to FIG. 12, if the start address SA corresponds to the NAND cell array 110d, initially, data of first and second pages of the NAND cell arrays 110d and 110a may be simultaneously sensed and latched (①). Then, during the data of the second page is output, data of a subsequent third page of the NAND cell array 110b may be sensed and latched (②). Then, during the data of the third page is output, data of a subsequent fourth page of the NAND cell array 110c may be sensed and latched (③). Then, during the data of the fourth page is output, data of a subsequent fifth page of the NAND cell array 110d may be sensed and latched (④).

As described above, regardless of the location of the start address SA, data of first through fourth pages from the start address SA may be sequentially and continuously output with no latency between pages. Also, if the above-described operation after the third page is repeated, all data from the start address SA of the first page may be sequentially and continuously output with no latency between pages. The above operation performance may satisfy the standard of a product required to continuously read data at a high speed with no latency between pages. For example, if data is output by using one serial output terminal (see SO of FIG. 8), the performance of a product may be improved.

While the present invention has been particularly shown and described with reference to exemplary embodiments thereof, it will be understood by one of ordinary skill in the art that various changes in form and details may be made therein without departing from the spirit and scope of the present invention as defined by the following claims.

| [Explanation of Reference Numerals] | |
|---|---|
| 100, 100a: non-volatile memory device | |
| 110a, 110b, 110c, 110d: NAND cell arrays | |
| 115a, 115b, 115c, 115d: X-decoders | |
| 120a, 120b, 120c, 120d: page buffers | |
| 130: control logic | 135: input address detection unit |
| 140: multiplexer latch unit | 150: I/O buffer & latch unit |
| 160: I/O interface | 200: electronic control system |
| 210: host | 220: memory chip |

The invention claimed is:

1. A non-volatile memory device comprising:
a first NAND cell array comprising a first group of pages;
a second NAND cell array comprising a second group of pages;
a plurality of X-decoders at least one-to-one connected to the first and second NAND cell arrays;
a plurality of page buffers at least one-to-one connected to the first and second NAND cell arrays so as to sense and latch data of the first and second NAND cell arrays; and
a control logic for controlling the plurality of X-decoders to simultaneously sense data of a first page of the first group of pages wherein a start address pages is positioned in the first page, and data of a second page of the second group of pages, the second page subsequent to the first page wherein the control logic controls the plurality of X-decoders to sense data of a third page subsequent to the second page during the data of the first page from the start address and the data of the second page is sequentially output to an external apparatus.

2. The non-volatile memory device of claim 1, wherein the first group of pages comprise the third page, and
wherein the third page is disposed in a row next to the first page.

3. The non-volatile memory device of claim 2, wherein the plurality of X-decoders comprise:
at least one first X-decoder connected to the first NAND cell array; and
at least one second X-decoder connected to the second NAND cell array.

4. The non-volatile memory device of claim 1, further comprising a third NAND cell array comprising a third group of pages,
wherein the third group of pages comprise the third page.

5. The non-volatile memory device of claim 4, wherein the plurality of X-decoders comprise:
at least one first X-decoder connected to the first NAND cell array;
at least one second X-decoder connected to the second NAND cell array; and
at least one third X-decoder connected to the third NAND cell array.

6. The non-volatile memory device of claim 1, further comprising an input address detection unit for detecting the start address.

7. The non-volatile memory device of claim 1, wherein each of the plurality of X-decoders comprises an X-multiplexer/driver.

8. The non-volatile memory device of claim 7, wherein the control logic continuously outputs data of the first and second NAND cell arrays from the start address via a serial peripheral interface (SPI) to an external apparatus with no latency between pages.

9. An electronic control system comprising:
a host; and
a memory chip for exchanging data with the host via a serial peripheral interface (SPI),
wherein the memory chip comprises the non-volatile memory device of claim 1.

10. A method of operating a non-volatile memory device, the method comprising:
detecting a start address of a first NAND cell array comprising a first group of pages, and a second NAND cell array comprising a second group of pages;
simultaneously sensing data of a first page of the first group of pages wherein the start address is positioned in the first page, and data of a second page of the second group of pages, the second page subsequent to the first page; and
sensing data of a third page subsequent to the second page during the data of the first page from the start address and the data of the second page is sequentially output to an external apparatus, wherein the simultaneous sensing comprises sensing and latching the data of the first and second pages respectively on first and second page buffers corresponding to the first and second pages.

* * * * *